(12) United States Patent
Cheng et al.

(10) Patent No.: US 11,017,999 B2
(45) Date of Patent: May 25, 2021

(54) METHOD AND STRUCTURE FOR FORMING BULK FINFET WITH UNIFORM CHANNEL HEIGHT

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 15/285,945

(22) Filed: Oct. 5, 2016

(65) Prior Publication Data

US 2018/0097091 A1  Apr. 5, 2018

(51) Int. Cl.
| | | |
|---|---|---|
| *H01L 21/02* | (2006.01) | |
| *H01L 29/78* | (2006.01) | |
| *H01L 29/10* | (2006.01) | |
| *H01L 29/06* | (2006.01) | |
| *H01L 21/308* | (2006.01) | |

(Continued)

(52) U.S. Cl.
CPC .... *H01L 21/02236* (2013.01); *H01L 21/3086* (2013.01); *H01L 21/7621* (2013.01); *H01L 29/0653* (2013.01); *H01L 29/1083* (2013.01); *H01L 29/66795* (2013.01);
(Continued)

(58) Field of Classification Search
CPC ... H01L 21/02236; H01L 21/306–3088; H01L 21/3086; H01L 21/7621; H01L 21/02241; H01L 21/823878; H01L 21/823481; H01L 21/762–76297; H01L 21/823431; H01L 21/823821; H01L 29/0653; H01L 29/1083; H01L 29/7851;
(Continued)

(56) References Cited

U.S. PATENT DOCUMENTS 7,279,774 B2   10/2007   Seo et al.
8,076,721 B2   12/2011   Tang et al.
(Continued)

OTHER PUBLICATIONS

Wu, C.C. et al., "High performance 22/20nm FinFET CMOS devices with advanced high-K/metal gate scheme" IEEE nternational Electron Devices Meeting (IEDM) (2010) paper 27-1, pp. 27.1.1-27.1.4.

*Primary Examiner* — Brigitte A Paterson
(74) *Attorney, Agent, or Firm* — Tutunjian & Bitetto, P.C.; Randall Bluestone (57) ABSTRACT

A method of a forming semiconductor fin structures that includes forming a plurality of fin structures with a first etch to a first depth in a substrate. The plurality of fin structures have a first width to the first depth. A spacer is formed on sidewalls of the plurality of fin structures. A second etch step can then extend the plurality of fin structures to a second depth with a second etch. The plurality of fin structures have a second width greater than the first width at the second depth portion. At least a portion of the trench separating adjacent fin structures may then be filled with a dielectric formed by an oxidation process. The portion of the fin structures extending above the dielectric fill is the active region of the fin structures which has a uniform height for all of the fin structure in the plurality of fin structures.

12 Claims, 8 Drawing Sheets

(51) Int. Cl.
*H01L 21/762* (2006.01)
*H01L 29/66* (2006.01)

(52) U.S. Cl.
CPC ...... *H01L 29/7851* (2013.01); *H01L 29/7853* (2013.01); *H01L 29/66537* (2013.01)

(58) Field of Classification Search
CPC . H01L 29/66795–66818; H01L 29/785–7856; H01L 2029/7857–7858
See application file for complete search history.

(56) References Cited

U.S. PATENT DOCUMENTS

| | | | |
|---|---|---|---|
| 8,431,466 B2 | 4/2013 | Lin et al. | |
| 8,841,188 B2 | 9/2014 | Reznicek et al. | |
| 8,940,602 B2 | 1/2015 | Basker et al. | |
| 9,112,052 B2 | 8/2015 | Chen et al. | |
| 9,159,576 B2 | 10/2015 | Song | |
| 9,209,178 B2 | 12/2015 | Kanakasabapathy et al. | |
| 2014/0124863 A1* | 5/2014 | Cheng | H01L 27/1211 257/350 |
| 2015/0200128 A1* | 7/2015 | Jacob | H01L 21/76224 438/424 |
| 2015/0270341 A1 | 9/2015 | Yin et al. | |
| 2016/0155670 A1* | 6/2016 | Liaw | H01L 21/823431 257/401 |
| 2016/0351591 A1* | 12/2016 | Xie | H01L 27/1211 |
| 2017/0005181 A1* | 1/2017 | Liou | H01L 21/308 |

\* cited by examiner

METHOD AND STRUCTURE FOR FORMING BULK FINFET WITH UNIFORM CHANNEL HEIGHT

BACKGROUND

Technical Field

The following description relates to semiconductor devices, and more particularly to semiconductor devices including fin structures.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one aspect, a method of a forming a plurality of semiconductor fin structures is described that employs a thermal oxidation to facilitate height uniformity across the plurality of fin structures. In one embodiment, the method includes forming a plurality of fin structures with a first etch to a first depth in a substrate, and forming a spacer on sidewalls of the plurality of fin structures. The plurality of fin structures has a first width to the first depth. A second etch extends the plurality of fin structures to a second depth. The plurality of fin structures has a second width greater than the first width from an end of the first depth to the second depth. An oxidation process fills at least a portion of a trench. The spacers are removed to expose the sidewalls of the plurality of fin structures, wherein a height dimension defined by a distance between an upper surface of the plurality of fin structures and an upper surface of a dielectric present in the trench is substantially uniform for said plurality of fin structures.

In another embodiment, a method of forming a semiconductor device is provided that includes forming a plurality of fin structures with a first etch to a first depth in a substrate, and forming a spacer on sidewalls of the plurality of fin structures. The plurality of fin structures have a first width to the first depth. A second etch extends the plurality of fin structures to a second depth. The plurality of fin structures have a second width greater than the first width from an end of the first depth to the second depth. An oxidation process fills at least a portion of a trench provided by the first and second etch steps. The spacers are removed to expose the sidewalls of the plurality of fin structures. A gate structure is formed on a channel region of the plurality of fin structures, and source and drain regions are formed on portions of the plurality of fin structures on opposing ends of the channel region. A height dimension for said plurality of fin structures defined by a distance between an upper surface of the plurality of fin structures and an upper surface of a dielectric present in the trench is substantially uniform.

In another aspect, a semiconductor device is provided that includes a plurality of fin structures. The plurality of fin structures having a passive height that that is coplanar with an upper surface of dielectric material separating adjacent fin structure, and an active height providing an active portion of the fin structures extending above the first height. The width of the plurality of fin structures at an interface of the passive height and the active height is greater than a width of the remaining portions of the plurality of fin structures. A gate structure is present on a channel portion region of the active portion of the fin structures. Source and drain regions are present on portions of active portion of the plurality of fin structures on opposing ends of the channel region.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures provided in the following description.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, can be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a method for controlling the height of fin structures. As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure.

The fin structures disclosed herein can provide the active region, i.e., the source, drain and channel portions, of fin structures for Fin Field Effect Transistors (FinFET). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

In a typical bulk FinFET process, the fin channel height is defined by recessing the dielectric material that is positioned in the trenches separating, i.e., electrically isolating, adjacent fin structures for one another. It has been determined that the etch processes typically employed to recess this dielectric material have a strong dependency upon the pattern density, e.g., the pitch separating adjacent fin structures. Therefore, the fin channel height formed using processes that rely upon dielectric trench fill processing followed by etch back processing, i.e., recessing of the deposited dielectric, have significant variations in the fin height for the portion of the fin structure including the channel region of a device. The variation in fin height leads to device variation, e.g., variations in electrical performance, which is undesired.

In some embodiments, the methods and structures disclosed herein provide fin structures having a dense pattern, i.e., tight pitch, and uniform height that is not provided prior to the methods and structures described herein. As will be described in further detail below the methods and structures provided herein include a process step in which a base portion of the fin structures is formed having a greater width than the overlying active portion of the fin structure, wherein the greater width base portion provides the side for thermal growth processes to provide for device isolation between adjacent fin structures, and a more uniform fin height for containing at least the channel region of the device. The methods and structures relating to the fin type semiconductor devices provided herein are now discussed with more detail referring to FIGS. 1-7B.

Figure 1:
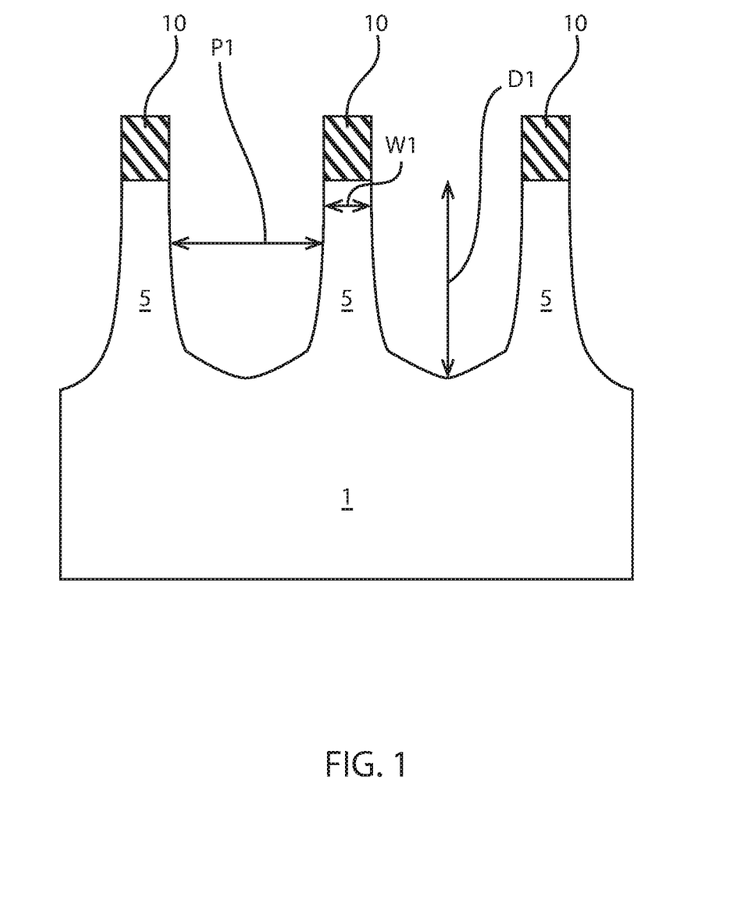
FIG. 1 is a side cross-sectional view depicting one embodiment of forming a plurality of fin structures to a first depth in a semiconductor substrate.

FIG. 1 depicts one embodiment of forming a plurality of fin structures 5 to a first depth D1 in a substrate 1, i.e., semiconductor substrate. The substrate 1 is typically a bulk semiconductor substrate. The bulk semiconductor substrate, and subsequently the fin structures 5 that are formed therefrom, can be composed of a type IV semiconductor material. For example, the semiconductor material of the substrate 1, (as well as the fin structure 5) may include, but is not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, and combinations thereof. In some other embodiments, the substrate 1 can be composed of another semiconductor material besides a type IV semiconductor, such as a type III-V semiconductor material, such as gallium arsenic, indium arsenic, indium phosphide, as well as other III/V and II/VI compound semiconductors. Other semiconductor materials may also be suitable so long as they thermally expand, i.e., volumetrically expand, in response to a thermal treatment, such as thermal oxidation.

The plurality of fin structures 5 can be formed deposition photolithography and etch processes. For example, forming the plurality of fin structures 5 can include forming a dielectric layer (for forming a hardmask 10) on an upper surface of the substrate 1; etching the dielectric layer using spacer image transfer (SIT) to form a hard mask 10 from the dielectric layer; and etching the substrate 1 using the hardmask 10 with an anisotropic etch to a first depth D1 to provide the initial fin structures 5.

The dielectric layer that provides the hardmask 10 can be composed of any dielectric layer or multiple layers that can function as an etch mask for etching the substrate 1. In some embodiments, the dielectric layer that provides the hardmask 10 may be composed of an oxide, nitride or oxynitride material. For example, when the substrate 1 is composed of silicon, the dielectric layer that provides the hardmask 10 may be composed of silicon nitride. The dielectric layer can be deposited using chemical vapor deposition (CVD), e.g., plasma enhanced chemical vapor deposition (PECVD).

In one embodiment, the patterning process used to define each of the fin structures 5 is a spacer image transfer (SIT) process. More specifically, the SIT process may be used to pattern the hardmask 10, wherein the hardmask 10 is then used in an etch process to define the fin structures 5. The SIT process can include forming a mandrel material layer (not shown) on the layer that provides the hard mask 10. The mandrel material layer can include any material (semiconductor, dielectric or conductive) that can be selectively removed from the structure during a subsequently performed etching process. In one embodiment, the mandrel material layer can be composed of amorphous silicon or polysilicon. In another embodiment, the mandrel material layer may be composed of a metal, such as, e.g., amorphous carbon. The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the dielectric layer that provides the hardmask 10.

In some embodiments, the SIT process can continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 5.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the dielectric layer that provides the hard mask 10. The pattern transfer can be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. Following patterning of the hard mask 10, the spacers formed during the SIT process can be removed. For example, the dielectric spacers can be removed using an etch process or a planarization process.

In a following process step, the hard mask 10 protects the portions of the substrate 1 that provide the fin structures 5, while the exposed portions of the substrate 1 that are not covered by the hard mask 10 are etched to form the trenches that separate the fin structures in the plurality of fin structures 5. Similar to the etch process for patterning the hard mask 10, the etch process for forming the plurality of fin structures 5 may be an anisotropic etch, such as reactive ion etch (RIE), plasma etch, laser etching or a combinations thereof. The etch process removes the exposed portions of the substrate 1 selectively to the hard mask 10. As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater. Besides SIT process, other suitable patterning techniques such as lithography followed by RIE can be used to form fins.

The fin structures 5 formed at this stage of the process flow can have a first height D1 ranging from 5 nm to 200 nm. In another embodiment, each of the fin structures 10 has a first height D1 ranging from 10 nm to 100 nm. In one example, each of the fin structures 5 has a height D1 ranging from 20 nm to 50 nm. Each of the plurality of fin structures 5 may have a width W1 ranging from 5 nm to 20 nm. In another embodiment, each of the fin structures 5 has a width W1 ranging from 5 nm to 15 nm. In one example, each fin structure 5 has a width W1 that is equal to 10 nm. The pitch P1 separating adjacent fin structures 5 may range from 10 nm to 50 nm. In another embodiment, the pitch P1 separating adjacent fin structures 5 can range from 30 nm to 45 nm. In one example, the pitch P1 is equal to 40 nm. Although three fin structures 5 are depicted in FIG. 1, the present disclosure is not limited to only this example. It is noted that any number of fin structures 5 may be formed from the semiconductor substrate 1.

Figure 2:
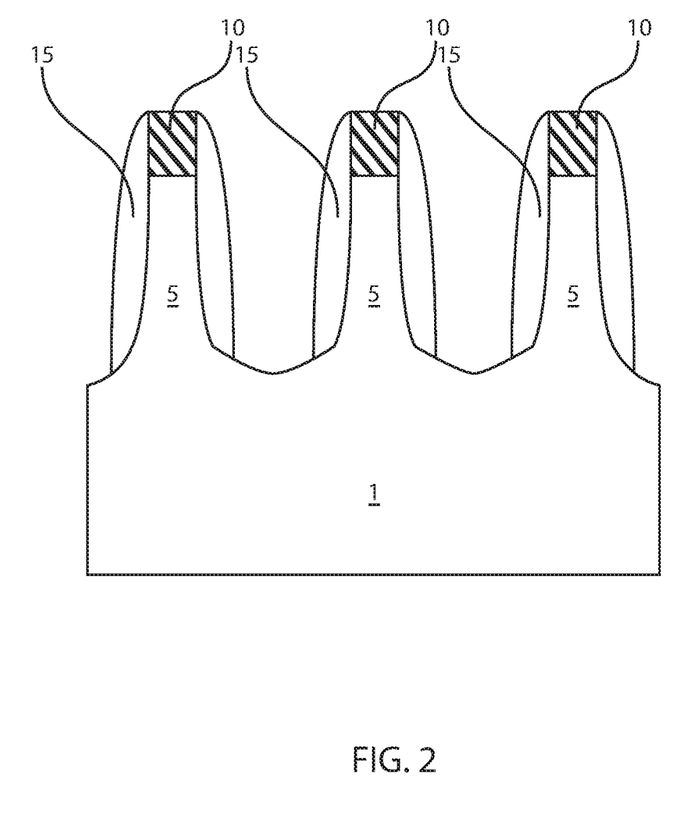
FIG. 2 is a side cross-sectional view depicting one embodiment of forming a spacer on sidewalls of the plurality of fin structure having the first depth.

FIG. 2 depicts one embodiment of forming a spacer 15 on sidewalls of the plurality of fin structures 5 having the first depth D1, i.e., first height. The dielectric spacer 15 can be formed by deposition of a dielectric spacer material, and then etching the deposited dielectric spacer material. The dielectric spacer material can comprise any dielectric spacer material, such as, for example, silicon nitride, silicon oxynitride, or a dielectric metal oxide, which allows for the substrate 1 to be etched without substantially etching the spacer 15. Examples of deposition processes that can be used in providing the dielectric spacer 15 material include, but are not limited to, chemical vapor deposition (CVD), plasma enhanced chemical vapor deposition (PECVD), or atomic layer deposition (ALD). Examples of etching that be used in providing the dielectric spacers 15 include any etching process such as, e.g., reactive ion etching (RIE).

Figure 3:
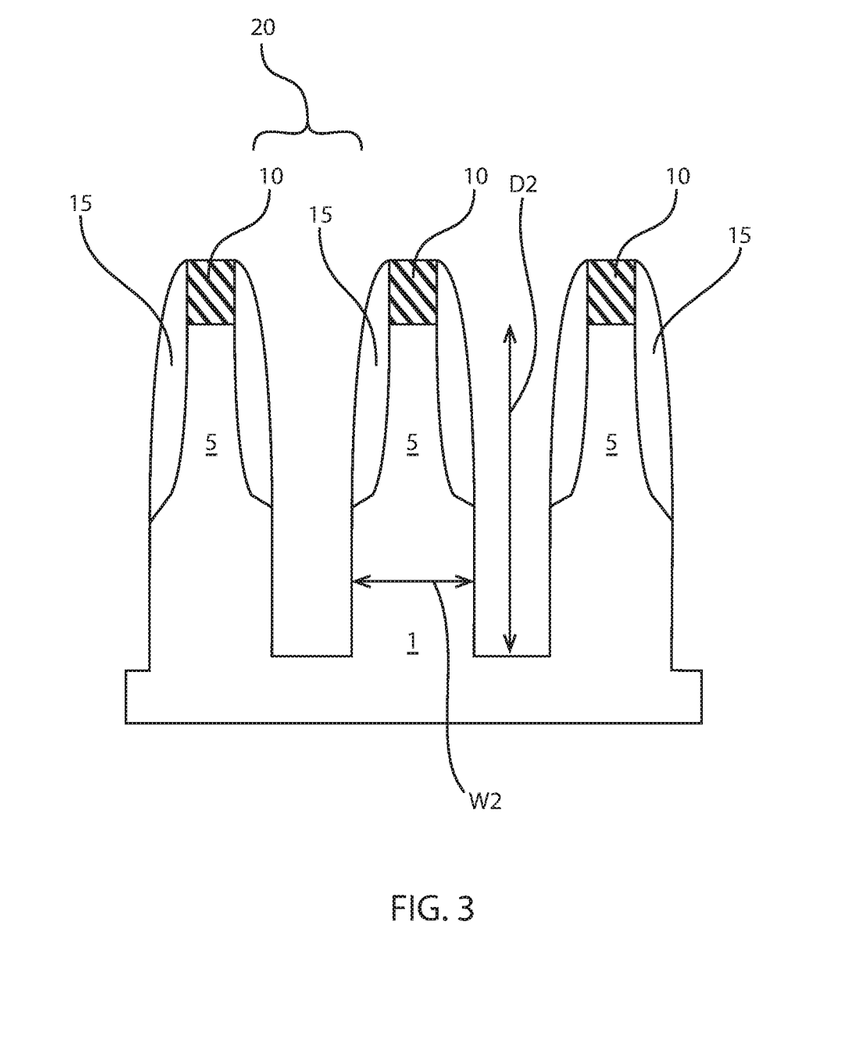
FIG. 3 is a side cross-sectional view depicting one embodiment of etching the semiconductor substrate after forming the spacers to extend the plurality of fin structures to a second depth, in which the width of the plurality of fin structures at the second depth is greater than the width of the plurality of fin structures at the first depth.

FIG. 3 depicts one embodiment of etching the semiconductor substrate 1 after forming the spacers 15 to extend the plurality of fin structures 5 to a second depth D2, in which the width W2 of the plurality of fin structures 5 at the second depth D2 is greater than the width W1 of the plurality of fin structures 5 at the first depth D1. The second depth D2 may extend into the substrate 1 by a dimension that ranges from 5 nm to 200 nm. In one example, each of the fin structures 5 is etched to a second depth D2 ranging from 15 nm to 100 nm.

The etch process for etching to a greater depth of the substrate 1 to increase the height of the fin structures 5 is selective to the spacers 15. Therefore, the width W2, i.e., the second width W2, of the fin structures 5 at the portion of the fin structures 5 height that is produced by etching to the second depth D2 is greater than the width W1 of the portion of the fin structures 5 that the dielectric spacers 15 are present on. In some embodiments, the second width W2 may range from 15 nm to 40 nm. In other embodiments, the second width W2 may range from 20 nm to 30 nm. In one example, the second width W2 is equal to approximately 25 nm.

In addition to being selective to the spacers 15, the etch process for further etching into the substrate 1 to increase the height of the fin structures 5 may also be selective to the hard mask 10. The openings formed in the substrate 1 to form the fin structures 5 may be referred to as trenches 20. The trenches 20 can be formed by an anisotropic etch process. The anisotropic etch process for removing the exposed portions of the substrate 1 to form the height of the fin structures 5 may be a reactive ion etch (RIE) process. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 4:
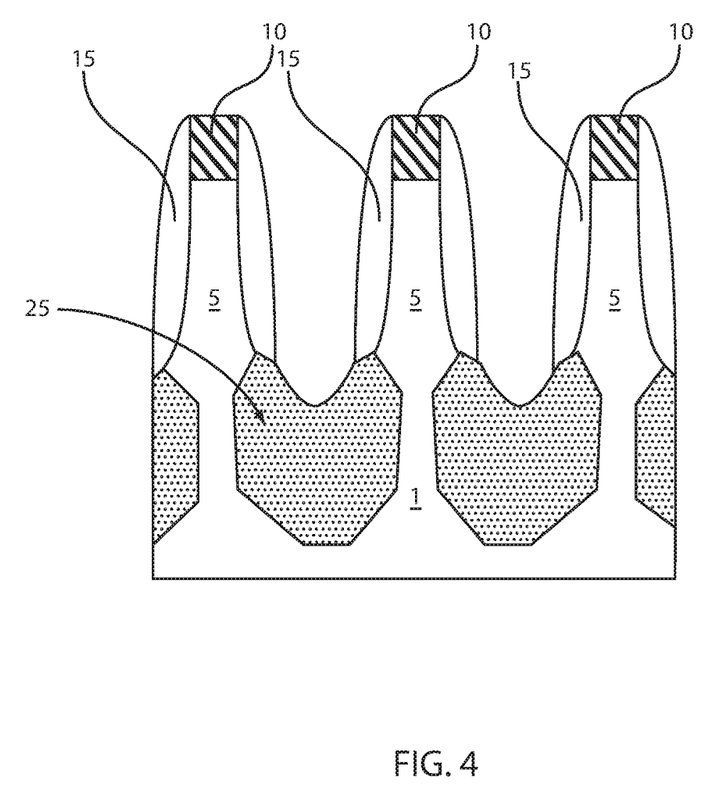
FIG. 4 is a side cross-sectional view depicting one embodiment of a thermal oxidation step, in which the volume expansion of the thermal oxidation fills a portion of the trench separating the adjacent fin structures.

FIG. 4 depicts one embodiment of a thermal oxidation step, in which the volume expansion of the thermal oxidation fills a portion of the trench 20 separating the adjacent fin structures 10. The thermal oxidation process includes subjecting the structure depicted in FIG. 3 to an oxygen containing atmosphere (e.g., oxygen gas, water vapor, oxygen plasma, etc.) at an elevated temperature to form an oxide. In some embodiments, the thermal oxidation process include annealing in an oxygen including atmosphere by furnace anneal, rapid thermal anneal (RTA), IR heating, laser annealing, and combinations thereof. The temperature of the thermal oxidation can range from 500° C. to 1350° C. In another example, the temperature of the thermal oxidation can range from 800° C. to 1150° C. The time period for the thermal oxidation process can range from 0.01 seconds to 120 minutes, depending on the oxidation species and temperature.

In some embodiments, during the thermal oxidation process, the oxygen containing atmosphere reacts with the exposed semiconductor surfaces of the substrate 1 within the trenches 20 to form an oxide containing dielectric. For example, when the substrate 1 is composed of silicon (Si), the thermal oxidation process may produce a dielectric of silicon oxide ($SiO_2$).

The oxidation consumes a portion of the substrate 1 extending from the trench sidewalls, providing a thermal oxide 25 that grows laterally undercutting the spacer 15. Because the portion of the fin structure 5 underlying the spacer 15 has a width, i.e., second width W2, that is greater than the width, i.e., first width W1, of the portion of the fin structure 5 having sidewalls that the spacer 15 is formed on; the consumption, i.e., conversion to dielectric, e.g., oxide, of the semiconductor material at the sidewalls of the trench 20 can cause the base portion of the fin structures 5 to be substantially equal in width to the upper portion of the fin structures 5. It is noted that the thermal oxide 25 is selectively formed on only the exposed semiconductor surfaces, i.e., sidewall and base of the trench 20 formed within the substrate 1. The thermal oxide 25 does not form on dielectric surfaces, such as the hard mask 10 and the dielectric spacers 15.

It is further noted that during the thermal oxidation, volumetric expansion of the oxide 25 being formed fills the lower portion of the trenches 20. For oxidation process, i.e., thermal oxidation process may provide a volumetric expansion of semiconductor material from the substrate 1 of 75% to 125%. In one example, in which the substrate 1 is composed of silicon (Si) and the thermal oxidation process produces silicon oxide ($SiO_2$), the volumetric expansion of the oxide being formed can be about 117%. For example, 1 nm of silicon (Si) from the portions of the substrate 1 that provides the sidewalls of the trench 20 may provide a thermal oxide of silicon oxide ($SiO_2$) that is 2.2 nm when the volumetric expansion is about 117%. The volumetric expansion provides lateral growth into the trench 20, i.e., in an opposite direction of the consumption of the trench sidewalls. Therefore, as the volumetric expansion continues provided by the thermal oxidation, the thermal oxide being formed will pinch off the lower portion of the trench 20 forming a trench isolation region. The trench isolation region provided by the thermal oxide 25 can extend from the base of the trench 20 to the dielectric spacers 15 present on the portion of the fin structures 5 having the first width W1.

Figure 5:
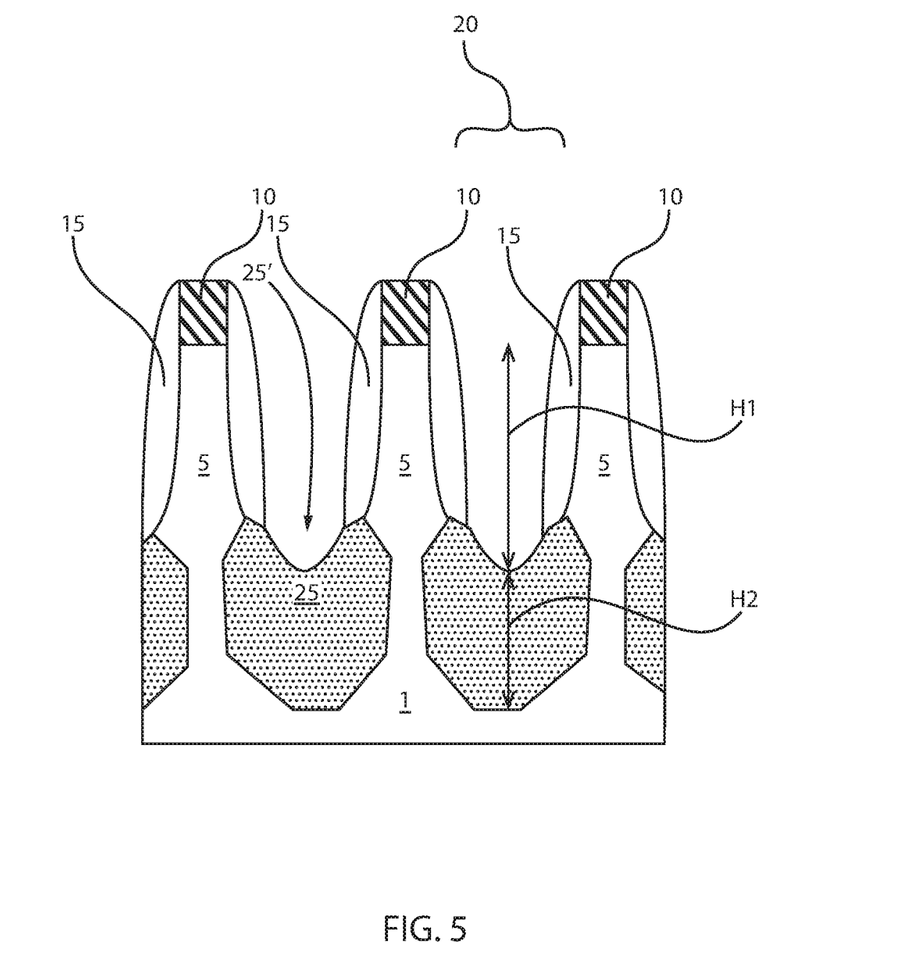
FIG. 5 is a side cross-sectional view depicting a deposition and etch back step for filling a divot present in an upper surface of the thermal oxide that is present separating adjacent fin structures.

In some embodiments, a divot can be present atop the trench isolation regions provided by the thermal oxide 25. FIG. 5 depicts one embodiment of depositing a dielectric material 25' followed by an etch back step for filling the divot. The dielectric material 25' that is formed atop the divot may be an oxide, nitride, oxynitride, SiCO, SiBCN, SiCN material. In some embodiments, the dielectric material 25' for filling the divot may have a same composition of the thermal oxide. In some embodiments, the dielectric material 25' and the thermal oxide 25 may both be oxides, such as silicon oxide ($SiO_2$). In other embodiments, the dielectric material 25' for filling the divot may have a different composition than the thermal oxide 25.

The dielectric material 25' may be formed using chemical vapor deposition (CVD), metal organic chemical vapor deposition (MOCVD), plasma enhanced chemical vapor deposition (PECVD), or atomic layer deposition (ALD). Examples of etching that can be used for the etch back process for determining the final thickness of the dielectric material 25' that is filling the divot atop the thermal oxide may include an anisotropic etch, such as reactive ion etch, plasma etch, or laser etching, or may include an isotropic etch, such as a wet chemical etch. The final thickness of the dielectric material 25' may range from 2 nm to 30 nm. In another embodiment, the final thickness of the dielectric material 25' may range from 5 nm to 15 nm.

The thermal oxide 25 formation followed by the divot fill provided by the dielectric material 25' provides the final height of the dielectric material that is formed within the trenches 20 that are separating adjacent fin structures 5. The portion of the fin structures 5 that extends above the thermal oxide 25 and dielectric material 25' that fills the divot is the active region portion of the fin structures 5 that includes the channel region, as well as the source region and drain region of the device. The dimension defined by the height of the active region portion of the fin structures 5 that extends above the thermal oxide 25 and dielectric material 25' is the fin height H1. In one embodiment, the fin height H1 can range from 5 nm to 100 nm. In another embodiment, the fin height H1 can range from 15 nm to 60 nm.

In some embodiments, the methods and structures disclosed herein provide fin structures having a dense pattern, i.e., tight pitch, and uniform height that is not provided prior to the methods and structures described herein. The term "uniform height" denotes that the height H1 of the active region portion of the fin structures 5 does not vary between the different fin structures 5 in the plurality of fin structures 5, in which the maximum variation of height is equal to 5% or less.

In a typical bulk FinFET process, the fin channel height is defined by recessing the dielectric material that is positioned in the trenches separating, i.e., electrically isolating, adjacent fin structures for one another. It has been determined that the etch processes typically employed to recess this dielectric material have a strong dependency upon the pattern density, e.g., the pitch separating adjacent fin structures. Therefore, the fin channel height formed using processes that rely upon dielectric trench fill processing followed by etch back processing, i.e., recessing of the deposited dielectric, have significant variations in the fin height of the fin structures.

As illustrated above, the majority of the dielectric fill that is separating adjacent fin structures 5 is provided by the thermal oxide 25, in which the portion of the fin structures extending above the thermal oxide 25 is the active region of the fin structure, i.e., portion of the fin structure including the channel region. Because the dielectric fill 25 fills the majority of the trench 20, i.e., with the exception of the minor fill amount provided by the dielectric material 25' for filling the divot, the methods disclosed herein are not dependent upon deposition and etch back steps to dictate the fin structure height. The methods and structures provided herein provide for a uniform fin height using thermal oxidation to provide isolation between adjacent fin structures.

Figure 6:
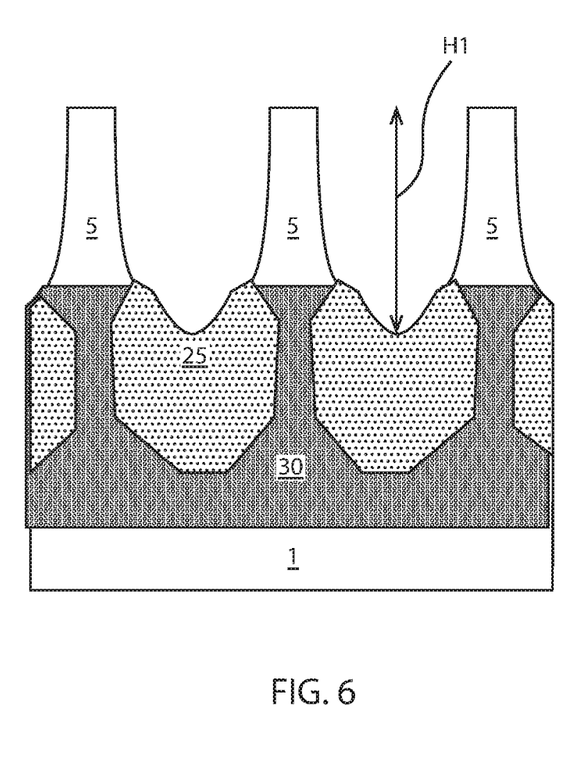
FIG. 6 is a side cross-sectional view depicting removing the sidewall spacers.

FIG. 6 depicts one embodiment of removing the dielectric spacers 15. The dielectric spacers 15 may be removed by an etch process that is selective to the fin structures 5. The etch process can be a dry etch process, such as reactive ion etch, or a wet etch process, such as a wet chemical etch. The etch process for removing the dielectric spacers 15 can also remove the hard mask 10.

FIG. 6 also depicts one embodiment of forming a punch-through stopper (PTS) region 30. The punch-through stopper (PTS) region 30 can reducing the incidence of leakage based performance degradation in FinFETs. The punch-through stopper (PTS) 30 improves FinFET characteristics. The dopant for forming the punch-through stop (PTS) region 30 may be an n-type or p-type dopant that has an opposite conductivity type as the dopant that determined the conductivity type of the FinFET. For example, the punch-through stop (PTS) region dopant may be an n-type or p-type dopant that has an opposite conductivity type as the dopant that dictates the conductivity type of the source and drain region of the FinFET. The punch-through stopper region 30 may be formed by ion implantation.

Figure 7A:
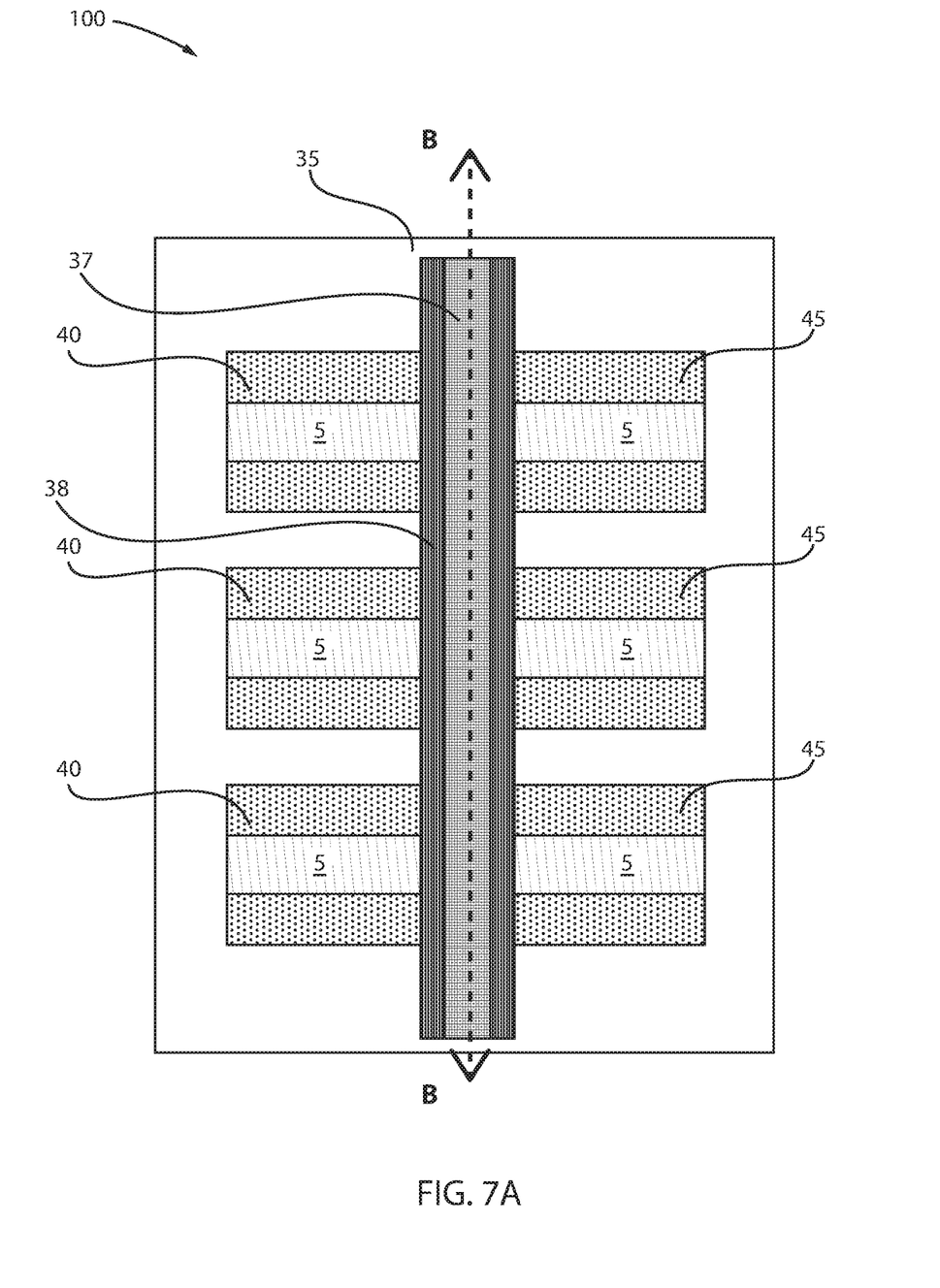
FIG. 7A is a top down view depicting forming a plurality of gate structures and source and drain regions on the fin structures described with reference to FIGS. 1-6.
Figure 7B:
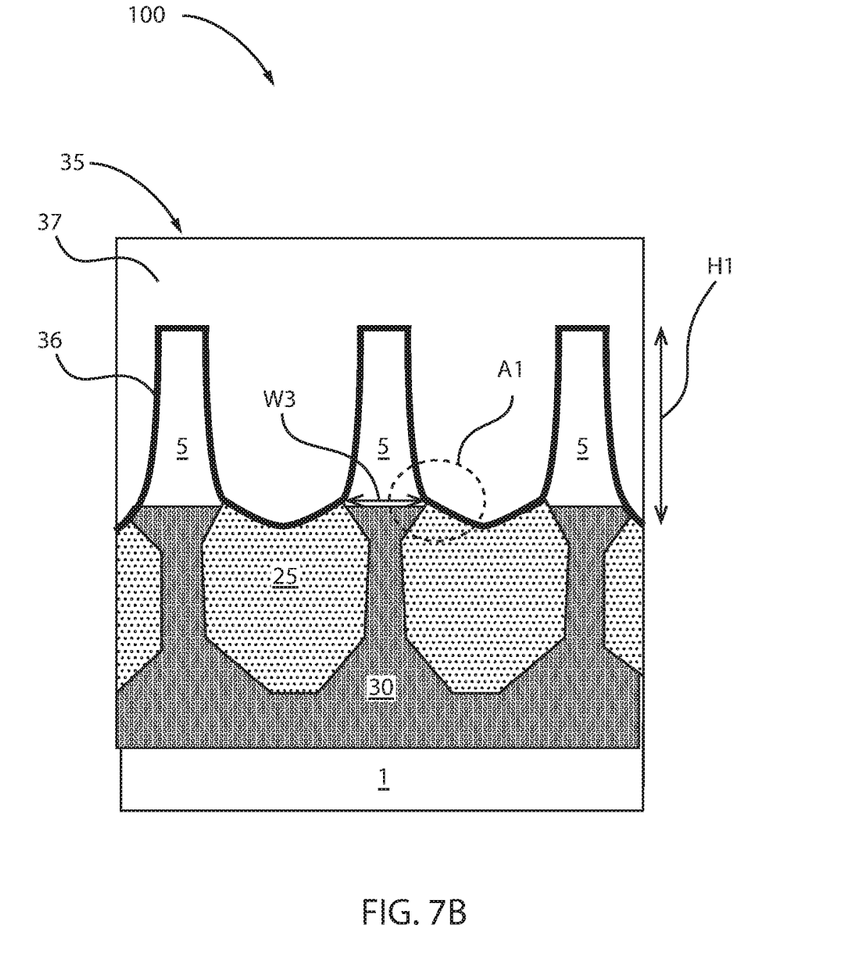
FIG. 7B is a side cross-sectional view of the structure depicted in FIG. 7A along section line B-B.

FIGS. 7A and 7B depict forming gate structures 35 and source and drain regions 40, 45 on the fin structures 5 described with reference to FIGS. 1-6. The "gate structure" functions to switch the semiconductor device from an "on" to "off" state, and vice versa. The gates structure 35 is formed on the channel region of the active region portion of the fin structures 5. The gate structure 35 typically includes at least a gate dielectric 36 that is present on the channel region of the fin structure 5 and a gate electrode 37 that is present on the gate dielectric 36.

In one embodiment, the at least one gate dielectric layer 36 includes, but is not limited to, an oxide, nitride, oxynitride and/or silicates including metal silicates, aluminates, titanates and nitrides. In one example, when the at least one gate dielectric layer 36 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer 36 has a thickness from 1 nm to 10 nm. In another embodiment, the at least one gate dielectric layer 36 has a thickness from 1 nm to 3 nm.

The conductive material of the gate electrode 37 may comprise polysilicon, SiGe, a silicide, a metal or a metal-silicon-nitride such as Ta—Si—N. Examples of metals that can be used as the gate electrode 37 include, but are not limited to, Al, W, Cu, and Ti or other like conductive metals. The layer of conductive material for the gate electrode 37 may be doped or undoped. If doped, an in-situ doping deposition process may be employed. Alternatively, a doped conductive material can be formed by deposition, ion implantation and annealing.

In some embodiments, the gate electrode may be composed of doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The gate electrode may further include a workfunction layer. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

The gate structure 35 may be formed by using a deposition method, such as an atomic layer deposition (ALD), a chemical vapor deposition (CVD) and/or a physical vapor deposition (PVD), to deposit the material layers for the at least one gate dielectric layer 36 and the at least one gate electrode 37 followed by patterning process. In some embodiments, a gate sidewall spacer 38 can be formed on the sidewall of the gate structure 10. In one embodiment, the gate sidewall spacer may be formed by using a blanket layer deposition process, such as CVD, and an anisotropic etch method.

FIGS. 7A and 7B also depict forming source and drain regions 40, 45 on the fin structures 5. The source and drain regions 40, 45 may be composed of epitaxially formed and in situ doped semiconductor material.

In some embodiments, the epitaxial semiconductor material that provides the source and drain regions 40, 45 may be composed of silicon (Si), germanium (Ge), silicon germanium (SiGe), silicon doped with carbon (Si:C) or the epitaxial semiconductor material may be composed of a type III-V compound semiconductor, such as gallium arsenide (GaAs). The epitaxial semiconductor material may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

In the embodiments in which the finFET device being formed has n-type source and drain regions, and is referred to as an n-type finFET, the doped epitaxial semiconductor material is doped with an n-type dopant to have an n-type conductivity. In the embodiments in which the finFET device being formed has p-type source and drain regions, and is referred to as a p-type finFET, the doped epitaxial semiconductor material is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In one embodiment, dopant from the doped epitaxial semiconductor material is diffused into the fin structures 5 to form an extension dopant region extending into the fin structures 5. In some embodiments, the diffusion, i.e., driving, of the dopant from the doped epitaxial semiconductor material into the extension region portions of the fin structures 5 comprises thermal annealing. In one embodiment, the thermal annealing that diffuses the dopant from the doped epitaxial semiconductor material into the extension region portions of the fin structures 5 includes an annealing process selected from the group consisting of rapid thermal annealing (RTA), flash lamp annealing, furnace annealing, laser annealing and combinations thereof.

It is noted that the above process sequence describes a gate first process sequence for forming FinFETs. The present description is not limited to only gate first processing. For example, gate last, which is also referred to as replacement gate processing, is also suitable for use with the methods and structures of the present description. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

The methods described above typically provides semiconductor device 100 providing a plurality of fin structures 5 having a passive height H2 that that is coplanar with an upper surface of dielectric material separating adjacent fin structures in the plurality of fin structures 5, and an active height H1 providing an active portion of the fin structures extending above the passive height H2, wherein the width W3 of the plurality of fin structures 5 at an interface of the passive height H2 and the active height H1 is greater than a width of the remaining portions of the plurality of fin structures 5. The passive height H2 is the portion of the fin structure 5 that is isolated by the thermal oxide 20. The active height H1 is the portion of the fin structure 5 that includes the source region, drain region and channel region of the device.

The interface of the passive height H2 and the active height H1 is depicted by reference number A1 and dashed circle that is encircling the interface in FIG. 7B. The width W3 of the plurality of fin structures 5 at the interface of the active and passive heights H1, H2 can range from 8 nm to 30 nm. In another embodiment, the width W3 of the plurality of fin structures 5 at the interface of the active and passive heights H1, H2 can range from 10 nm to 15 nm.

In some embodiments, the interface A1 of the active and passive heights H1, H2 for the fin structures 5 having the greatest width W3 includes a facetted sidewall geometry. More specifically, each sidewall of the fin structures 5 includes an extending portion having an apex. The dimension for one apex on one side of the fin structure 5 to a second apex on the second side of the fin structure 5 provides the greatest width W3 of the fin structure. The apex is substantially aligned with the upper surface of the thermal oxide 25. The semiconductor device 100 including the fin structures 5 depicted in FIGS. 7A and 7B have substantially uniform height H1 (active height), i.e., the variation in height of the fin structures in the plurality of fin structures is less than 5%.

Still referring to FIGS. 7A and 7B each semiconductor device, e.g., FinFET, includes a gate structure 35 present on a channel portion region of the active portion of the fin structures; and source and drain regions 40, 45 present on portions of active portion of the plurality of fin structures 5 on opposing ends of the channel region.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of a forming a plurality of semiconductor fin structures comprising:
    forming a plurality of fin structures with a first etch to a first depth in a substrate, wherein the plurality of fin structures have a first width to the first depth, wherein the substrate is a type IV semiconductor;
    forming a spacer on sidewalls of the plurality of fin structures;
    extending the plurality of fin structures to a second depth with a second etch, wherein the plurality of fin structures have a second width greater than the first width from an end of the first depth to the second depth;
    forming a dielectric with an oxidation process applied to the second width of the plurality of fin structures, the dielectric formed by the oxidation process filling at least a portion of a trench to provide an isolation region separating adjacent fin structures in the plurality of fin structures, wherein a height dimension defined by a distance between an upper surface of the plurality of fin structures and an upper surface of a dielectric present in the trench is uniform for said plurality of fin structures, wherein no portion of a lateral width of the plurality of the fin structures is completely oxidized by said oxidation process, wherein the oxidation process comprises thermal oxidation that includes heating in an oxygen containing atmosphere to convert the type IV semiconductor to an oxide;
    depositing a dielectric material in the trench between adjacent fin structures and recessing the dielectric material to fill a divot atop the dielectric formed by the oxidation process; and
    forming a gate structure on a channel region of the plurality of fin structure when the dielectric layer that provides the isolation has already been formed and is present while the gate structure is formed so that the dielectric layer is in a semiconductor device structure that includes the plurality of fin structures and the gate structure, wherein the gate structure functions to switch the semiconductor device structure.

2. The method of claim 1 further comprising removing the spacers to expose the sidewalls of the plurality of fin structures.

3. The method of claim 1, wherein forming the plurality of fin structures with the first etch comprises:
    forming a dielectric layer on an upper surface of the substrate;
    etching the dielectric layer using spacer image transfer (SIT) to form a hard mask from the dielectric layer; and
    etching a semiconductor layer of the substrate using the hardmask with an anisotropic etch to the first depth.

4. The method of claim 3, wherein the first width ranges from 5 nm to 20 nm, the first depth ranges from 15 nm to 60 nm, and adjacent fin structures in the first plurality of fin structures are separated by a pitch ranging from 20 nm to 40 nm.

5. The method of claim 1, wherein extending the plurality of fin structures to a second depth with a second etch comprises an anisotropic etch that removes a material of the substrate selectively to the sidewall spacers.

6. The method of claim 5, wherein the second width ranges from 15 nm to 40 nm, and the second depth ranges from 15 nm to 100 nm.

7. The method of claim 1, wherein said uniform means less than a 5% variation in height of the plurality of fin structures.

8. A method of a forming a plurality of semiconductor fin structures comprising:
 forming a plurality of fin structures with a first etch to a first depth in a substrate, wherein the plurality of fin structures have a first width to the first depth, wherein the substrate is a type IV semiconductor;
 forming a spacer on sidewalls of the plurality of fin structures;
 extending the plurality of fin structures to a second depth with a second etch, wherein the plurality of fin structures have a second width greater than the first width from an end of the first depth to the second depth;
 forming a dielectric with an oxidation process applied to the second width of the plurality of fin structures, the dielectric formed by the oxidation process filling at least a portion of a trench to provide an isolation region separating adjacent fin structures in the plurality of fin structures, wherein a height dimension defined by a distance between an upper surface of the plurality of fin structures and an upper surface of a dielectric present in the trench is uniform for said plurality of fin structures, wherein no portion of a lateral width of the plurality of the fin structures is completely oxidized by said oxidation process, wherein the oxidation process comprises thermal oxidation that includes heating in an oxygen containing atmosphere to convert the type IV semiconductor to an oxide, wherein the oxidation process comprises a volumetric expansion of semiconductor material in the substrate of 75% to 125%; and
 forming a gate structure on a channel region of the plurality of fin structure when the dielectric layer that provides the isolation has already been formed and is present while the gate structure is formed so that the dielectric layer is in a semiconductor device structure that includes the plurality of fin structures and the gate structure, wherein the gate structure functions to switch the semiconductor device structure.

9. A method of forming a semiconductor device comprising:
 forming a plurality of fin structures with a first etch to a first depth in a substrate, the plurality of fin structures having a first width to the first depth, wherein the substrate is a type IV semiconductor;
 forming a spacer on sidewalls of the plurality of fin structures;
 extending the plurality of fin structures to a second depth with a second etch, wherein the plurality of fin structures have a second width greater than the first width from an end of the first depth to the second depth;
 filling at least a portion of a trench separating adjacent fin structures in the plurality of fin structures with a dielectric formed by an oxidation process applied to the second width of the plurality of fin structures, the dielectric formed by the oxidation process filling at least a portion of a trench to provide an isolation region separating adjacent fin structures, wherein no portion of a lateral width of the plurality of the fin structures is completed oxidized by said oxidation process, wherein the oxidation process comprises thermal oxidation that includes heating in an oxygen containing atmosphere to convert the type IV semiconductor to an oxide;
 depositing a dielectric material in the trench between adjacent fin structures and recessing the dielectric material to fill a divot atop the dielectric formed by the oxidation process; and
 forming a gate structure on a channel region of the plurality of fin structures, and source and drain regions on portions of the plurality of fin structures on opposing ends of the channel region, wherein a height dimension for said plurality of fin structures defined by a distance between an upper surface of the plurality of fin structures and an upper surface of a dielectric present in the trench is uniform, wherein said gate structure is formed when the dielectric layer that provides the isolation has already been formed and is present while the gate structure is formed so that the dielectric layer is in a semiconductor device structure that includes the plurality of fin structures and the gate structure.

10. The method of claim 9 further comprising removing the spacers to expose the sidewalls of the plurality of fin structures.

11. The method of claim 9, wherein extending the plurality of fin structures to a second depth with a second etch comprises an anisotropic etch that removes a material of the substrate selectively to the sidewall spacers.

12. The method of claim 9, wherein said uniform means less than a 5% variation in height of the plurality of fin structures.

* * * * *